United States Patent
Kim et al.

(10) Patent No.: US 12,387,933 B2
(45) Date of Patent: Aug. 12, 2025

(54) METHOD FOR FORMING PHOTORESIST PATTERN AND METHOD FOR FORMING PATTERN ON A SUBSTRATE

(71) Applicant: Samsung Electronics Co., Ltd., Suwon-si (KR)

(72) Inventors: Gyeyoung Kim, Suwon-si (KR); Woojin Jung, Suwon-si (KR); Soonmok Ha, Suwon-si (KR); Junsik Yu, Suwon-si (KR); Seungkyo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 341 days.

(21) Appl. No.: 18/125,936

(22) Filed: Mar. 24, 2023

(65) Prior Publication Data
US 2023/0386841 A1   Nov. 30, 2023

(30) Foreign Application Priority Data
May 27, 2022 (KR) .................. 10-2022-0065202

(51) Int. Cl.
| | | |
|---|---|---|
| H01L 21/033 | (2006.01) | |
| G03F 7/00 | (2006.01) | |
| H01L 21/311 | (2006.01) | |
| H01L 21/66 | (2006.01) | |

(52) U.S. Cl.
CPC ...... H01L 21/0335 (2013.01); G03F 7/70533 (2013.01); H01L 21/0337 (2013.01); H01L 21/31144 (2013.01); H01L 22/20 (2013.01)

(58) Field of Classification Search
None
See application file for complete search history.

(56) References Cited

U.S. PATENT DOCUMENTS

| | | |
|---|---|---|
| 6,210,846 B1 | 4/2001 | Rangarajan et al. |
| 6,872,663 B1 | 3/2005 | Okada |
| 7,403,259 B2 | 7/2008 | Kruijswijk et al. |
| 7,413,848 B2 | 8/2008 | Chung et al. |
| 7,679,715 B2 | 3/2010 | Kruijswijk et al. |
| 9,773,836 B1* | 9/2017 | Crocco ............... H10F 39/028 |
| 2008/0220375 A1* | 9/2008 | Kim ................... G03F 7/40 430/315 |
| 2018/0096840 A1 | 4/2018 | Jeong et al. |

FOREIGN PATENT DOCUMENTS

| | | |
|---|---|---|
| TW | 200512802 A | 4/2005 |
| TW | 202117468 A | 5/2021 |

OTHER PUBLICATIONS

Office Action dated Nov. 23, 2023 from the Taiwan Intellectual Property Office for corresponding Taiwanese Patent Application No. 112116204.

* cited by examiner

*Primary Examiner* — Roberts P Culbert
(74) *Attorney, Agent, or Firm* — Muir Patent Law, PLLC

(57) ABSTRACT

Provided is a method for forming a photoresist pattern, in which a silicon oxide layer is formed on a substrate. A first photoresist pattern, which contacts the silicon oxide layer, is formed on the silicon oxide layer. Entire-surface exposure is performed on the substrate on which the first photoresist pattern having a defect is formed. The first photoresist pattern is entirely removed by developing the first photoresist pattern, which has been subject to the entire-surface exposure. In addition, a second photoresist pattern is formed on the silicon oxide layer.

20 Claims, 9 Drawing Sheets

METHOD FOR FORMING PHOTORESIST PATTERN AND METHOD FOR FORMING PATTERN ON A SUBSTRATE

CROSS-REFERENCE TO RELATED APPLICATION

This application claims priority under 35 USC § 119 to Korean Patent Application No. 10-2022-0065202 filed on May 27, 2022 in the Korean Intellectual Property Office (KIPO), the entire disclosure of which is incorporated herein by reference.

BACKGROUND

1. Field

Embodiments of the present disclosure relate to a method for forming a photoresist pattern and a method for forming a pattern on a substrate. More particularly, embodiments of the present disclosure relate to a method for forming a photoresist pattern and a method for forming a pattern, which includes a rework for the photoresist pattern.

2. Description of the Related Art

While manufacturing a semiconductor element, a photoresist pattern may be formed to pattern a layer. In a photolithography process for forming the photoresist pattern, defects may occur in the photoresist pattern by process defects or process variations. When the defect of the photoresist pattern occurs, a rework process for entirely removing the photoresist pattern may be performed. After the rework process, the photolithography process may be performed again to form a photoresist pattern. When the rework process for the photoresist pattern is performed, a silicon oxide layer formed under the photoresist pattern may also be removed by a partial thickness. In this case, the silicon oxide layer may have a thickness that is thinner than a target thickness without obtaining the target thickness.

SUMMARY

Example embodiments provide a method for forming a photoresist pattern, which includes a rework for the photoresist pattern.

Example embodiments provide a method for forming a pattern, which includes a rework of a photoresist pattern.

According to embodiments of the present disclosure, there is provided a method for forming a photoresist pattern, in which a silicon oxide layer is formed on a substrate. A first photoresist pattern, which contacts the silicon oxide layer, is formed on the silicon oxide layer. The first photoresist pattern includes a defect. Entire-surface exposure is performed on the substrate on which the first photoresist pattern with the defect is formed. The first photoresist pattern is entirely removed by developing the first photoresist pattern, which has been subject to the entire-surface exposure. In addition, a second photoresist pattern is formed on the silicon oxide layer and contacts the silicon oxide layer.

According to embodiments of the present disclosure, there is provided a method for forming a photoresist pattern, in which a silicon oxide layer having a first thickness is formed on a substrate. A first photoresist pattern, which contacts the silicon oxide layer, is formed on the silicon oxide layer by using a photolithography process apparatus. Entire-surface exposure is performed on the substrate on which the first photoresist pattern is formed when a defect occurs in the first photoresist pattern by an entire-surface exposure unit of the photolithography process apparatus. A baking process of heating the substrate including the first photoresist pattern, which has been subject to the entire-surface exposure, is performed by the photolithography process apparatus. The first photoresist pattern is entirely removed by developing the first photoresist pattern, which has been subject to the entire-surface exposure, by the photolithography process apparatus. In addition, a second photoresist pattern is formed on the silicon oxide layer having the first thickness by the photolithography process apparatus.

According to embodiments of the present disclosure, there is provided a method for forming a pattern on a substrate, in which a first mandrel layer and a first separation layer are formed on the substrate divided into a first region and a second region. First structures extending to have a line shape while being spaced apart from each other are formed on the substrate in the first region, and a second structure is formed on the substrate in the second region, by patterning the first mandrel layer and the first separation layer. A silicon oxide layer having a first thickness is conformally formed on surfaces of the substrate, the first structures, and the second structure. A first photoresist pattern covering the silicon oxide layer formed on the substrate in the second region and contacting the silicon oxide layer is formed. Entire-surface exposure is performed on the substrate on which the first photoresist pattern is formed when a defect occurs in the first photoresist pattern. The first photoresist pattern is entirely removed by developing the first photoresist pattern, which has been subject to the entire-surface exposure. A second photoresist pattern, which covers the silicon oxide layer formed on the substrate in the second region, is formed on the silicon oxide layer. Spacers, each having a first width that is equal to the first thickness, are formed on side walls of the first structures by anisotropically etching the silicon oxide layer by using the second photoresist pattern as an etching mask. In addition, the first structure between the spacers is removed.

According to exemplary embodiments, the photoresist pattern can be entirely removed without reducing a thickness of the silicon oxide layer formed under the photoresist pattern. Therefore, the silicon oxide layer can have a target thickness, so that a semiconductor element including the silicon oxide layer can have target electrical characteristics.

DETAILED DESCRIPTION OF THE EMBODIMENTS

Hereinafter, exemplary embodiments of the present disclosure will be described in detail with reference to the accompanying drawings.

Figure 1:
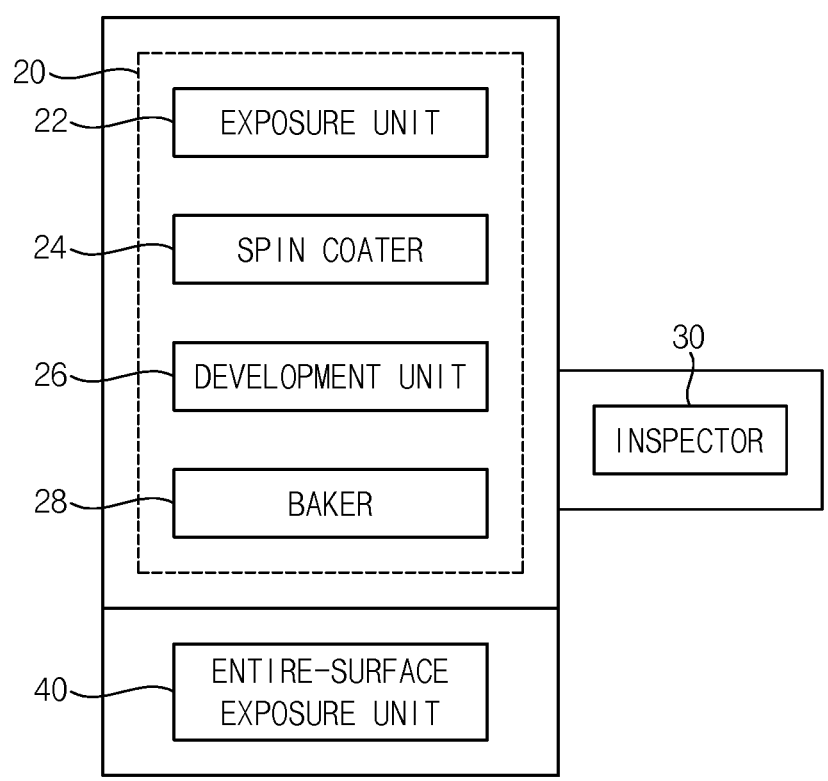
FIG. 1 is a block diagram showing a photolithography process apparatus according to an exemplary embodiment.

FIG. 1 is a block diagram showing a photolithography process apparatus according to an exemplary embodiment.

Referring to FIG. 1, a photolithography process apparatus 10 may include a photolithography processor 20 configured to perform a photolithography process, an inspector 30 configured to perform inspection, and an entire-surface exposure unit 40 configured to perform a rework.

The photolithography processor 20, also described as a photolithography processing assembly, may include a baker 28 configured to heat a substrate, a spin coater 24 configured to coat the substrate, a development unit 26, and an exposure unit 22. Although not shown in the drawing, the photolithography processor 20 may further include a handler configured to move the substrate, a chiller configured to cool the substrate, and the like. The development unit 26, also described as a development component, may introduce a developer while rotating the substrate. The exposure unit 22, also described as an exposure component, may perform an exposure process for forming a photoresist pattern. The exposure unit 22 may perform exposure in a scanner scheme.

The inspector 30, also described as an inspection component, may inspect errors or defects in the photoresist pattern formed by the photolithography processor 20. The inspector 30 may inspect, for example, a line width, a thickness, a side wall profile, an overlay arrangement, and the like of a photoresist. The inspector 30 may include, for example, a scanning electron microscope.

The entire-surface exposure unit 40 may be provided to entirely remove the photoresist pattern when an error or a defect occurs in the photoresist pattern. The entire-surface exposure unit 40 may include a UV lamp module. A light source used in the entire-surface exposure unit may have a wavelength of 157 nm to 248 nm. For example, the light source may include an ArF light source (a laser of ArF) having a wavelength of 193 nm, a KrF light source (a laser of KrF) having a wavelength of 248 nm, an F2 light source (a laser of F2) having a wavelength of 157 nm, and the like. According to an exemplary embodiment, the light source may be the same light source used in the exposure unit 22 of the photolithography processor 20. The entire-surface exposure unit 40 may perform exposure in a scanner scheme.

The photolithography process apparatus may be generally referred to as a photolithography track system. The photolithography track system may include the entire-surface exposure unit 40 for a rework process. However, in some embodiments, the photolithography track system does not include a plasma etcher, a wet station, or the like for the rework process.

Figure 2:
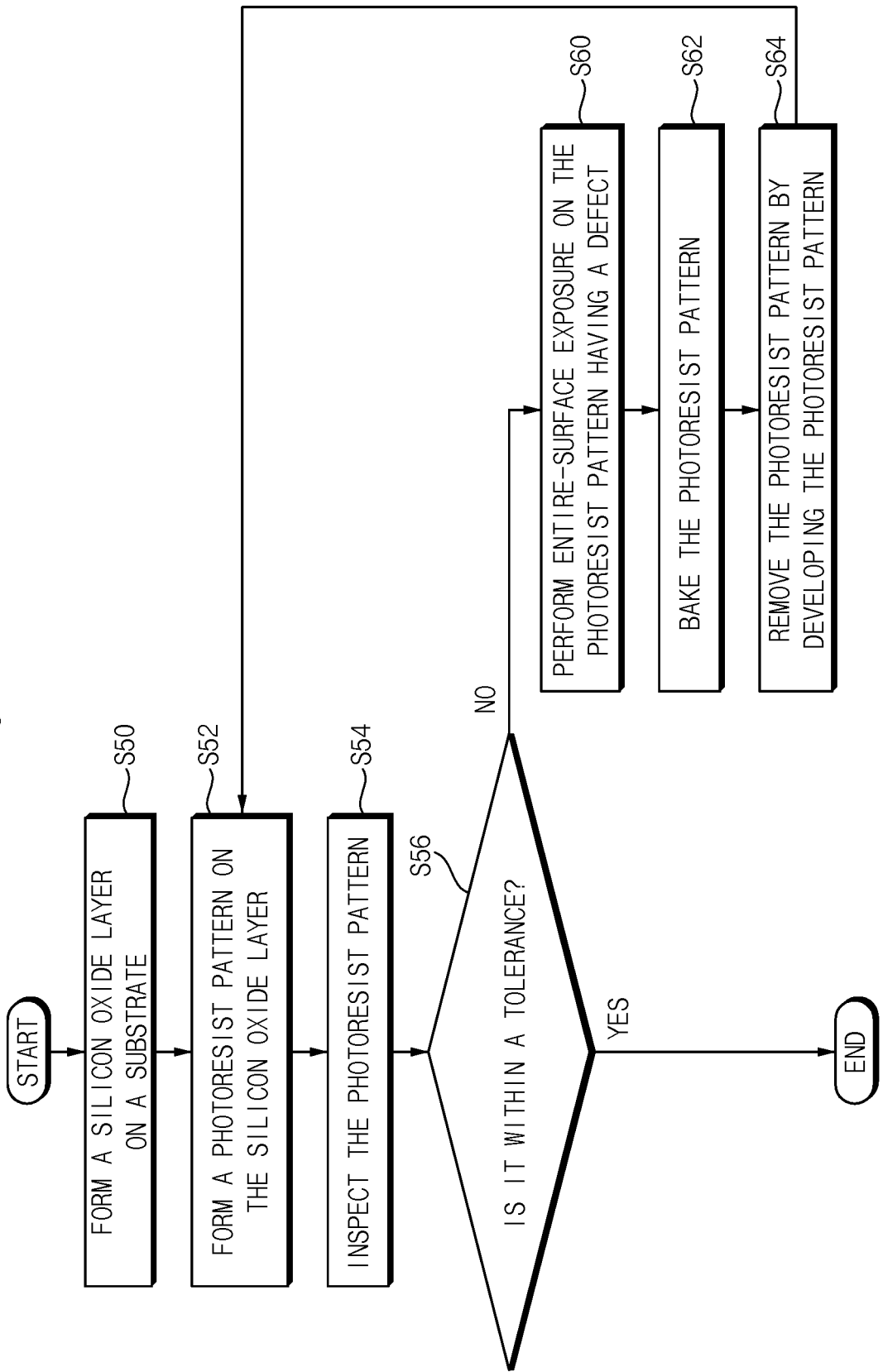
FIG. 2 is a flowchart showing a method for forming a photoresist pattern according to exemplary embodiments.

FIG. 2 is a flowchart showing a method for forming a photoresist pattern according to exemplary embodiments. FIGS. 3 to 7 are sectional views showing the method for forming the photoresist pattern according to the exemplary embodiments.

A method for forming a photoresist pattern, which will be described below, may include a rework process for a photoresist pattern.

Figure 3:
FIGS. 3 to 7 are sectional views showing the method for forming the photoresist pattern according to the exemplary embodiments.

Referring to FIGS. 2 and 3, a silicon oxide layer 102 is formed on a substrate 100 on which a lower structure (not shown) is formed (S50). The silicon oxide layer 102 may be an uppermost etching target layer etched by using a photoresist pattern as a mask. The silicon oxide layer 102 may have a first thickness that is a target thickness.

The substrate 100 may include or be formed of a single crystal semiconductor material. The substrate 100 may include a semiconductor material such as silicon, germanium, or silicon-germanium. According to an exemplary embodiment, the substrate 100 may be formed of single crystal silicon.

According to an exemplary embodiment, the silicon oxide layer 102 may be formed through an atomic layer deposition (ALD) scheme. According to an exemplary embodiment, the first thickness of the silicon oxide layer 102 may be a thin thickness of 10 Å to 1000 Å. According to an exemplary embodiment, the silicon oxide layer 102 may be provided as a hard mask pattern or a gate insulating layer pattern through a subsequent process.

Figure 4:
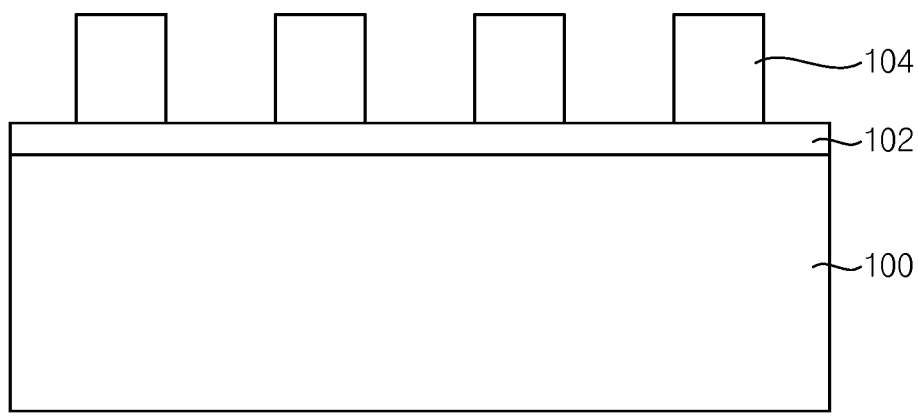

Referring to FIGS. 2 and 4, a photoresist pattern 104 is formed on the silicon oxide layer 102 (S52). The photoresist pattern 104 may be formed by performing a coating process, an exposure process, and a development process for a photoresist layer. The process of forming the photoresist pattern 104 may be performed by the photolithography processor 20 of the photolithography process apparatus of FIG. 1.

The photoresist pattern 104 may contact with top surface of the silicon oxide layer 102. Therefore, for example, an anti-reflection layer may not be formed between the photoresist pattern 104 and the silicon oxide layer 102. In addition, a surface of the silicon oxide layer 102 may be exposed between portions of the photoresist patterns 104. The photoresist pattern 104 may be formed of a positive photoresist material having a higher solubility for the developer at an exposed portion. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact. Other words used to describe the relationship between elements should be interpreted in a like fashion (e.g., "between" versus "directly between," "adjacent" versus "directly adjacent," etc.).

Hereinafter, one example of the method for forming the photoresist pattern 104 may be described. A pattern, as described herein, may refer to a separated individual piece of a processed (i.e., patterned) layer, or to the entire processed (i.e., patterned) layer. First, a photoresist layer may be formed by spin-coating a photoresist composition on the silicon oxide layer 102. A first baking process of heating the substrate on which the photoresist layer is formed may be performed. The spin coating process may be performed by the spin coater 24 (e.g., coating machine) of the photolithography processor 20, and the first baking process may be performed by the baker 28 (e.g., baking oven) of the photolithography processor 20.

Thereafter, the photoresist layer may be selectively exposed through an exposure process. The exposure process may be performed by the exposure unit 22 in the photolithography processor 20. In order to perform the exposure process, first, a reticle having a circuit pattern may be located on a mask stage, and the reticle may be aligned with the substrate 100. Thereafter, the reticle may be irradiated with light to react the photoresist layer with the light that has passed through the reticle.

After the exposure process, a second baking process may be performed on the substrate 100. Thereafter, an exposed portion of the photoresist layer may be removed by developing the photoresist layer that has been subject to the exposure process. Therefore, the photoresist pattern 104 may be formed. The developer used in the development process may include, for example, tetra-methyl ammonium hydroxide (TMAH). The second baking process may be performed by the baker 28 of the photolithography processor 20, and the development process may be performed by the development unit 26 of the photolithography processor 20.

A defect may occur in the photoresist pattern 104 while the above processes are performed. Therefore, inspection may be performed to determine whether the photoresist pattern 104 is normally formed (S54). For example, a line width, a thickness, a side wall profile, an overlay arrangement, and the like of the photoresist pattern 104 may be inspected. The inspection process may be performed by the inspector.

When the photoresist pattern 104 is within a tolerance in the inspection, the photolithography process may be completed (S56). Therefore, subsequent processes of performing etching by using the photoresist pattern 104 as an etching mask may be performed.

On the other hand, when the photoresist pattern 104 deviates from the tolerance in the inspection, the photoresist pattern 104 may be determined as having a defect (S56). In this case, a rework process of entirely removing the photoresist pattern 104 may be performed. As one example, when the photoresist pattern 104 does not have a target line width or is not formed at a target position, the rework process may be performed. Hereinafter, the rework process for the photoresist pattern 104 will be described.

Figure 5:
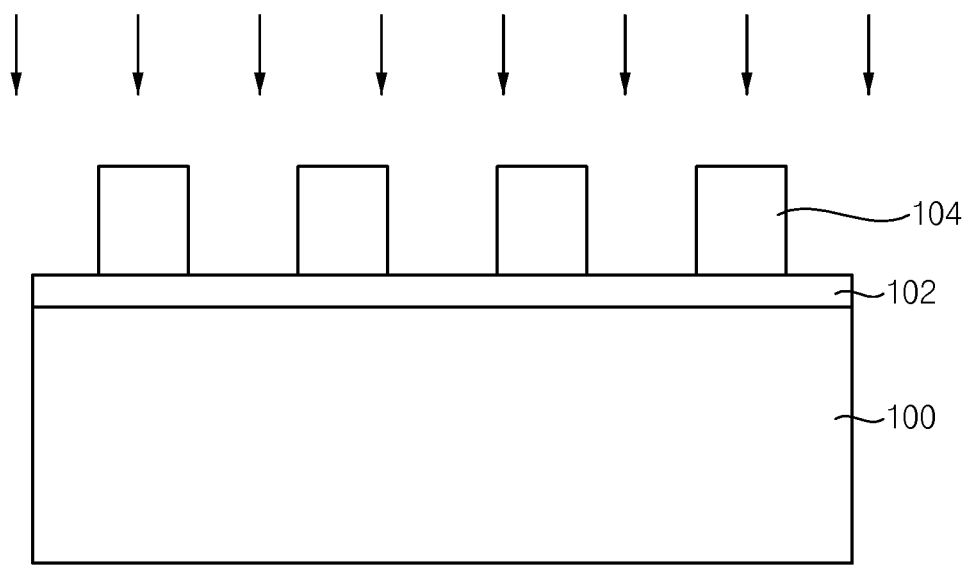

Referring to FIGS. 2 and 5, entire-surface exposure may be performed on the substrate 100 on which the photoresist pattern 104 including the defect is formed (S60).

The entire-surface exposure may also be referred to as blank exposure or flood exposure. The entire-surface exposure may indicate exposure of an entire surface (e.g., top surface and in some embodiments also side surfaces) of the photoresist pattern (or the photoresist layer) formed on the substrate without a reticle. The entire-surface exposure may include radiating a light toward the entire top surface of the structure formed on the substrate 100 and including the photoresist pattern 104. The light source used in the entire-surface exposure process may be ultraviolet light. The light source may have a wavelength of 157 nm to 248 nm. For example, the light source may include an ArF light source (a laser of ArF) having a wavelength of 193 nm, a KrF light source (a laser of KrF) having a wavelength of 248 nm, an F2 light source (a laser of F2) having a wavelength of 157 nm, and the like.

According to an exemplary embodiment, the light source may be the same light source used in the exposure process for patterning the photoresist pattern 104. The entire-surface exposure process may be performed by the entire-surface exposure unit. According to the exemplary embodiment, the entire-surface exposure process may be performed by using a blank mask (e.g., a mask with an opening exposing an entire top surface of the structure formed on the substrate 100) under the same process condition as the exposure process for forming the photoresist pattern 104.

When the entire-surface exposure process is performed, acid (H+) may be generated from a photoacid generator included in the photoresist pattern 104. Therefore, the photoresist pattern 104 may have a higher solubility for the developer.

Thereafter, a third baking process may be performed on the substrate 100 on which the photoresist pattern 104 is formed, which has been subject to the entire-surface exposure (S62).

According to an exemplary embodiment, the third baking process may be performed under the same process condition as the second baking process. The third baking process may be performed, for example, at a temperature of about 80° C. to about 150° C. Terms such as "about" or "approximately" may reflect amounts, sizes, orientations, or layouts that vary only in a small relative manner and within manufacturing tolerances, for example in a way that does not significantly alter the operation, functionality, or structure of certain elements. When the third baking process is performed, the acid generated inside the photoresist pattern 104 in the entire-surface exposure process may be diffused so that the photoresist pattern 104 may be easily dissolved in the developer. The third baking process may be performed by the baker 28 of the photolithography processor 20.

Figure 6:

Referring to FIGS. 2 and 6, the photoresist pattern 104 may be entirely removed by performing a development process (S64). For example, the development process may be performed by using an aqueous solution of tetra-methyl ammonium hydroxide (TMAH) as a developer. The development process may be performed by the development unit 26 of the photolithography processor 20.

In order to entirely remove the photoresist pattern 104 by the development process to prevent particles from remaining on an edge of the substrate 100, in the development process, the developer may be introduced while the substrate is rotated at a high speed of 120 RPM or more. For example, the substrate 100 may be rotated at a speed of 120 RPM to 3000 RPM. When the substrate 100 is rotated at a speed that is lower than 120 RPM, the photoresist pattern 104 may not be entirely removed, and when the substrate 100 is rotated at a speed that is higher than 3000 RPM, it may be difficult to stably support the substrate.

In the development process, the silicon oxide layer 102 exposed between the photoresist patterns 104 may be rarely etched without being damaged by the developer. According to the exemplary embodiment, when the process is performed, the silicon oxide layer 102 may be etched by a thickness that is thinner than 1 Å. As one example, the silicon oxide layer 102 may have the first thickness without being etched.

A general rework process using conventional methods may be performed through an oxygen plasma ashing process or a removal process using a wet etchant or a cleaning solution. In this case, the silicon oxide layer formed under the photoresist pattern may be removed by a partial thickness. For example, the silicon oxide layer may be removed by a thickness of 4 Å to 10 Å. Since a thickness of the silicon oxide layer is reduced, a process defect of a semiconductor element may occur. In particular, when the thickness of the silicon oxide layer is very thin, a ratio of the thickness by which the silicon oxide layer is removed to a deposition thickness of the silicon oxide layer may be increased, which may cause an operation defect of the semiconductor element. Therefore, when the silicon oxide layer is exposed between the photoresist patterns, it may be undesirable to perform the oxygen plasma ashing process or the removal process using the wet etchant or the cleaning solution. However, layers other than the silicon oxide layer may not be removed by the oxygen plasma ashing process or the removal process using the wet etchant, or a process problem may not occur even when the layers other than the silicon oxide layer are removed. Therefore, when the silicon oxide layer is not exposed between the photoresist patterns, the oxygen plasma ashing process or the removal process using the wet etchant or the cleaning solution may be performed.

Through the above process, the rework process for entirely removing the photoresist pattern 104 may be performed without damage or thickness reduction of the silicon oxide layer 102. As described above, the entire-surface exposure, baking, and development processes included in the rework process may be performed by the photolithography process apparatus 10. Since the rework process is not performed in a separate rework apparatus, a separate rework apparatus may not be required. Therefore, the rework process may be performed more efficiently.

Figure 7:
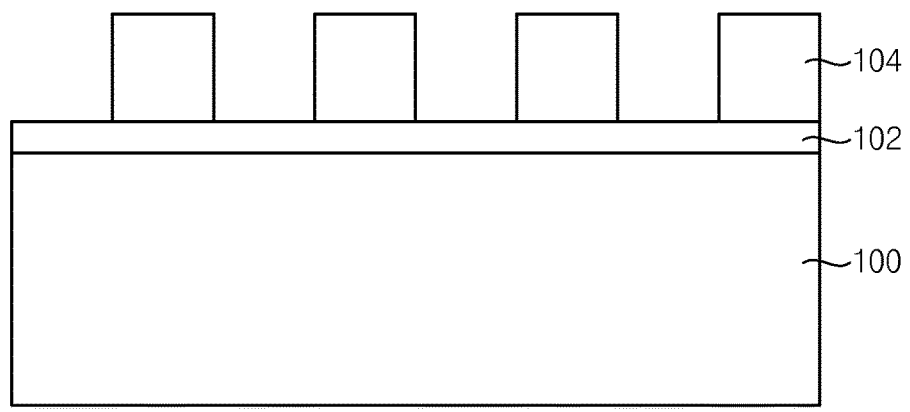

Referring to FIGS. 2 and 7, a photoresist pattern 104 may be formed again on the silicon oxide layer 102 (S52). The photoresist pattern 104 may be formed by performing a coating process, an exposure process, and a development process for a photoresist layer. The process of forming the photoresist pattern 104 may be performed by the photolithography processor 20 of the photolithography process apparatus 10 of FIG. 1. Thereafter, the inspection and rework processes may be sequentially performed.

As described above, after the rework process is performed, the photoresist pattern 104 may be formed by the same photolithography process apparatus. Accordingly, the process of forming the photoresist pattern 104 may be simplified.

FIGS. 8 to 16 are sectional views for describing a method for forming a pattern according to exemplary embodiments.

A method for forming a pattern may include a rework process for a photoresist pattern. Hereinafter, a case in which the silicon oxide layer is used as a spacer provided as an etching mask in a double patterning process or a quadruple patterning process will be described.

Figure 8:
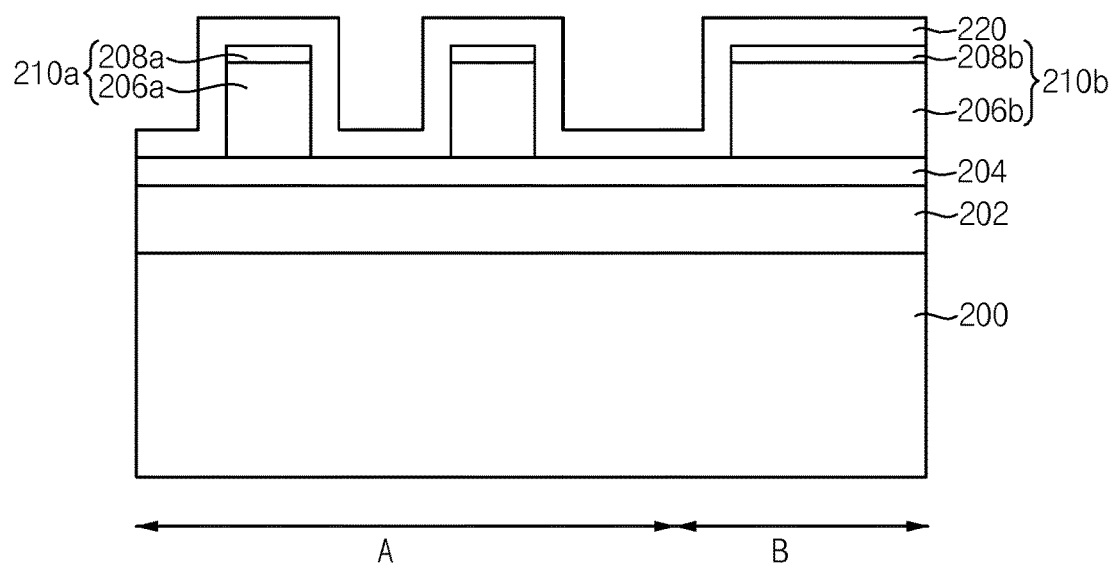
FIGS. 8 to 16 are sectional views for describing a method for forming a pattern according to exemplary embodiments.

Referring to FIG. 8, a first mandrel layer 202 and a first separation layer 204 may be formed on a substrate 200. The substrate 200 may include a cell pattern region A and a peripheral region B. Although not shown in the drawing, an etching target layer may be further formed on the substrate 200.

A second mandrel layer and a second separation layer may be formed on the first separation layer 204. The first mandrel layer 202 may include or be formed of, for example, amorphous carbon. The second mandrel layer may include or be formed of, for example, a spin-on hard mask. Each of the first separation layer 204 and the second separation layer may include or be formed of silicon oxynitride. The first and second separation layers may be provided as anti-reflection layers. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" In a particular claim) may be described elsewhere with a different ordinal number (e.g., "second" in the specification or another claim).

The second separation layer and the second mandrel layer may be patterned to form a first mandrel pattern 206a and a first separation layer pattern 208a on the cell pattern region A of the substrate 200, and form a second mandrel pattern 206b and a second separation layer pattern 208b on the peripheral region B of the substrate 200.

According to an exemplary embodiment, a first structure 210a in which the first mandrel pattern 206a and the first separation layer pattern 208a are stacked may have a line shape extending in one direction (e.g., in a first horizontal direction). The first structure 210a may have a line width (e.g., in a second horizontal direction perpendicular to the first horizontal direction) that is three times a first line width, which is a target line width of the pattern to be formed in a subsequent process. In addition, an interval in the second direction between the first structures 210a may be up to five times the first line width. A second structure 210b in which the second mandrel pattern 206b and the second separation layer pattern 208b are stacked may cover the first separation layer 204 on the peripheral region B.

A first silicon oxide layer 220 may be conformally formed on surfaces of the first structure 210a, the second structure 210b, and the first separation layer 204.

The first silicon oxide layer 220 may be provided as a hard mask for etching the first mandrel layer 202 and the first separation layer 204, which are formed under the first silicon oxide layer 220, through a subsequent process.

The first silicon oxide layer 220 may be deposited to have a first thickness (the thickness being measured in a direction perpendicular to the surface on which the first silicon oxide layer 220 is conformally formed) that is substantially equal to the first line width. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise. In order to form the first silicon oxide layer 220 with a thin thickness, the first silicon oxide layer 220 may be formed through an atomic layer deposition (ALD) scheme. According to the exemplary embodiment, the first silicon oxide layer 220 may have a thickness of 10 Å to 1000 Å.

Figure 9:
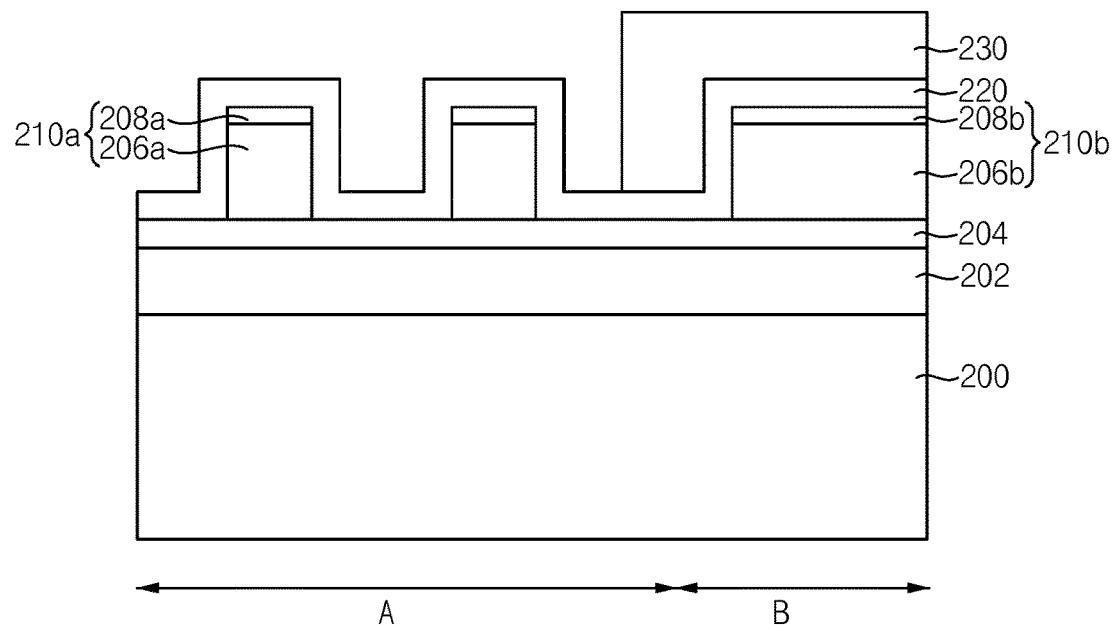

Referring to FIG. 9, a second photoresist pattern 230 may be formed on the first silicon oxide layer 220. The second photoresist pattern 230 may cover the first silicon oxide layer 220 formed on the peripheral region B. The second photoresist pattern 230 may selectively expose the first silicon oxide layer 220 on the cell pattern region A. Therefore, an etching target layer etched by the second photoresist pattern 230 may be the first silicon oxide layer 220. The first silicon oxide layer 220 may contact the second photoresist pattern 230.

The process of forming the second photoresist pattern 230 may be the same as the process described with reference to FIGS. 2 and 4. For example, the second photoresist pattern 230 may be formed by performing a coating process, a first baking process, an exposure process, a second baking process, and a development process for a positive photoresist material.

Figure 10:
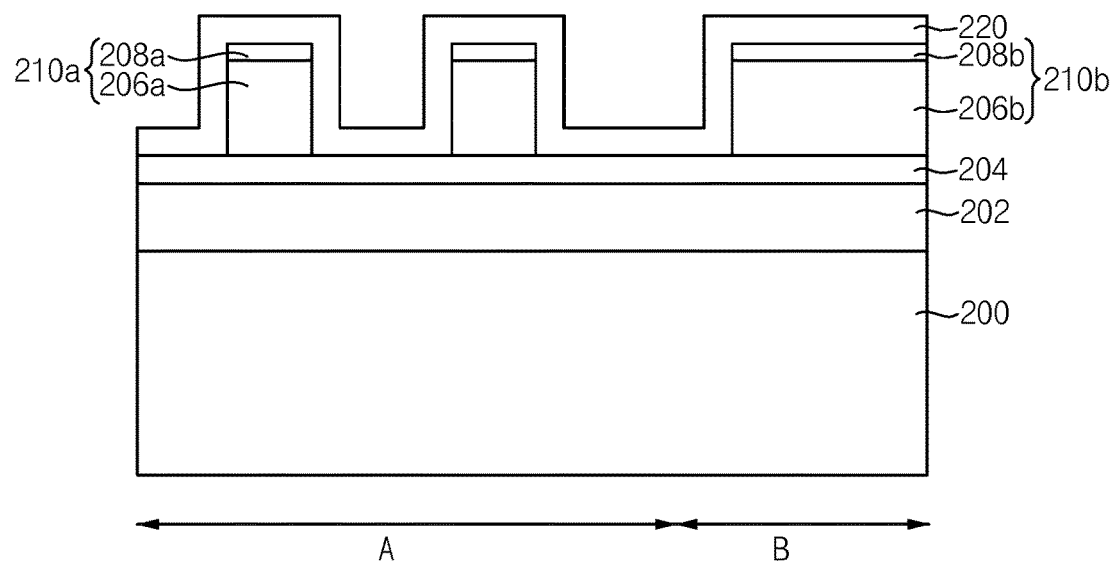

Referring to FIG. 10, an inspection process may be performed on the second photoresist pattern 230 (e.g., before performing any etching of the first silicon oxide layer 220), and when the second photoresist pattern 230 deviates from a tolerance in the inspection, a rework process of entirely removing the second photoresist pattern 230 may be performed. After the rework process is performed, the first silicon oxide layer 220 may be exposed.

The rework process may be substantially the same as the rework process described with reference to FIGS. 2, 5, and 6. For example, in order to perform the rework process, entire-surface exposure may be performed on the second photoresist pattern 230. A baking process of heating the second photoresist pattern 230, which has been subject to the entire-surface exposure, may be performed. The second photoresist pattern 230 may be developed by using a developer. In the developing process, the developer may be introduced while the substrate is rotated at a speed of 120 RPM or more. Therefore, the second photoresist pattern 230 may be entirely removed.

The first silicon oxide layer 220 may not be etched or damaged in the process of performing the rework process. For example, even after the rework process is performed, the first silicon oxide layer 220 may have a first thickness that is equal to the first line width.

Figure 11:
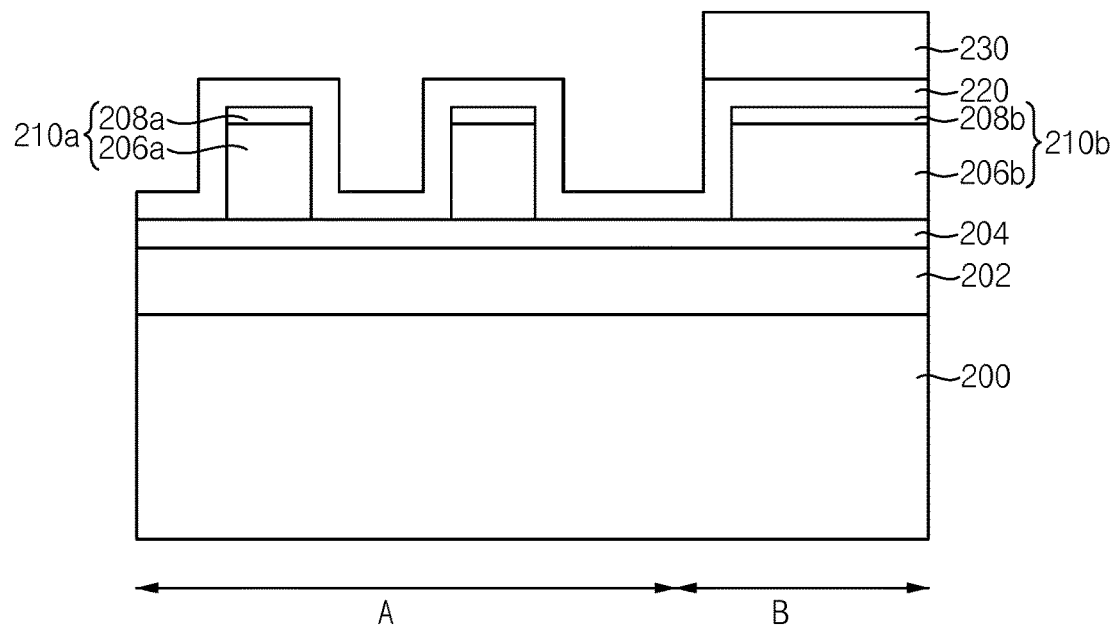

Referring to FIG. 11, a second photoresist pattern 230 may be formed again on the first silicon oxide layer 220.

In addition, an inspection process may be performed on the second photoresist pattern 230, and when the second photoresist pattern 230 is within the tolerance in the inspection, a subsequent etching process may be performed. When the second photoresist pattern 230 deviates from the tolerance in the inspection, the rework process may be performed again.

The processes described with reference to each of FIGS. 9 to 11 may be performed by the same photolithography process apparatus. For example, the deposition of the first photoresist pattern 230, the inspection and removal, and the reforming of the second photoresist pattern 230 may be performed by a single photolithography apparatus, without moving the substrate to a different apparatus or chamber.

Figure 12:
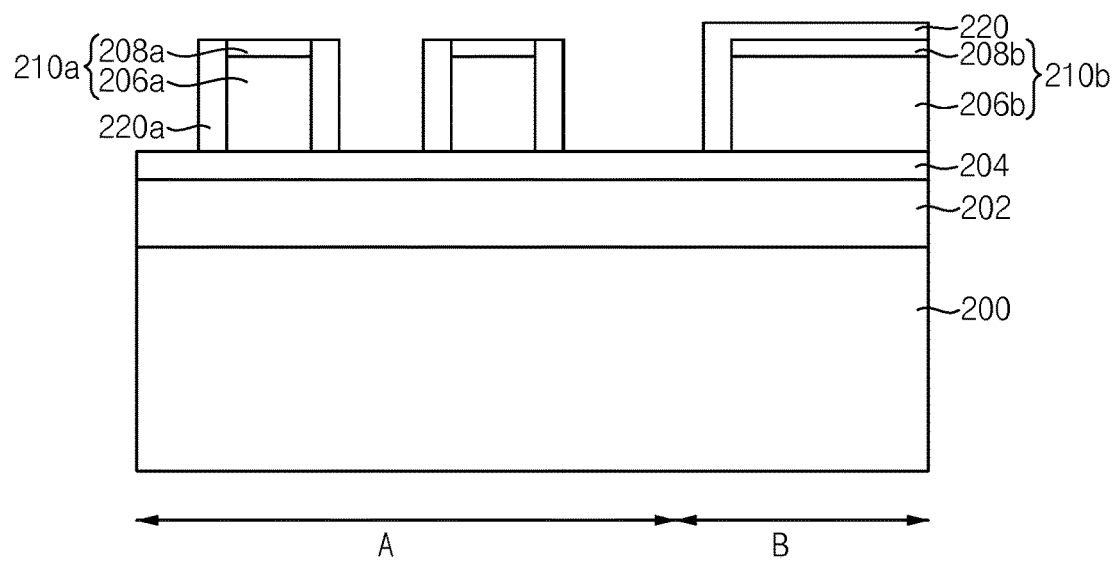

Referring to FIG. 12, a first spacer 220a may be formed on a side wall of the first structure 210a by anisotropically etching the first silicon oxide layer 220. The first spacer 220a may be provided as a hard mask for etching the first mandrel layer 202 and the first separation layer 204, which are formed under the first spacer 220a.

In this case, since the first silicon oxide layer 220 on the peripheral region B is masked by the second photoresist pattern 230, the first silicon oxide layer 220 may be covered on a surface of the second structure 210b on the peripheral region B.

Figure 13:
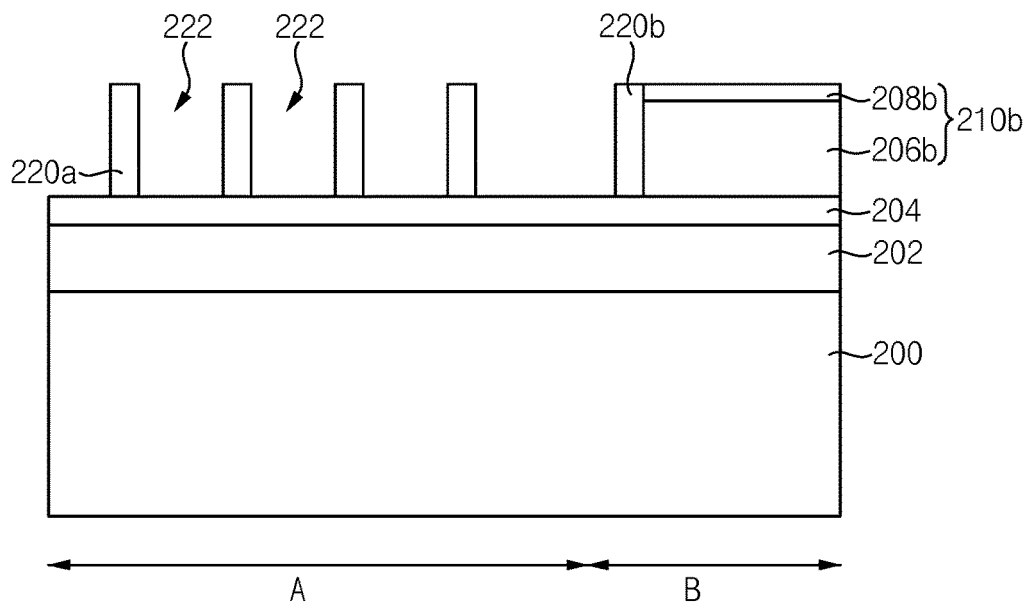

Referring to FIG. 13, the first structure 210a may be selectively removed. Therefore, the first spacers 220a on the first separation layer 204 in the cell pattern region A may be spaced apart from each other. Therefore, a first gap 222 may be formed between the first spacers 220a.

Meanwhile, since the second structure 210b on the peripheral region B is covered with the first silicon oxide layer 220, the second structure 210b may remain without being removed in the removal process. A side wall spacer 220b may be formed on a side wall of the second structure 210b.

As described above, since the first silicon oxide layer 220 has the first thickness that is equal to the first line width even after the rework process is performed, the first spacer 220a may have the first line width that is the target line width. In addition, a width of the first gap 222 between the first spacers 220a may be maintained uniformly.

On the contrary, when the first silicon oxide layer is removed by a partial thickness to have a thickness that is thinner than the first line width after the rework process is performed, the first spacer may have a line width that is smaller than the first line width that is the target line width. In this case, an interval between the first spacers may become relatively wider. In addition, a width of a first gap portion formed by removing the first structure and a width of a first gap portion corresponding to a separation portion between the first spacers may be different from each other. Therefore, the width of the first gap between the first spacers may not be uniform, and a first gap having a relatively large width and a first gap having a relatively small width may be alternately and repeatedly arranged.

Figure 14:
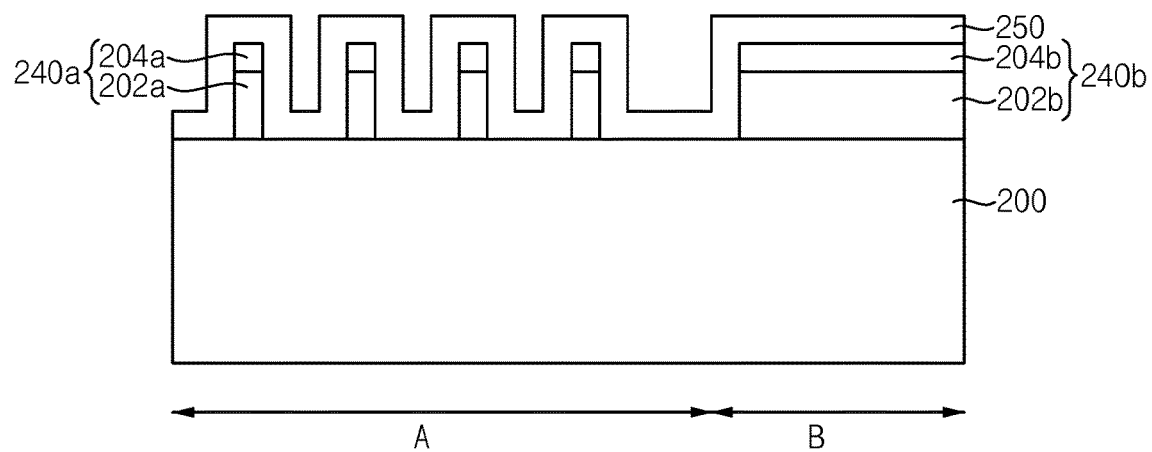

Referring to FIG. 14, the first separation layer 204 and the first mandrel layer 202 exposed between the first spacers 220a may be anisotropically etched by using the first spacers 220a as an etching mask. Therefore, a third structure 240a in which a third mandrel pattern 202a and a third separation layer pattern 204a are stacked may be formed on the substrate 200 in the cell pattern region A. When the etching process is performed, a fourth structure 240b in which a fourth mandrel pattern 202b and a fourth separation layer pattern 204b are stacked may be formed on the substrate 200 in the peripheral region B.

Thereafter, a second silicon oxide layer 250 may be conformally formed on surfaces of the third structure 240a, the fourth structure 240b, and the substrate 200. The second silicon oxide layer 250 may be deposited to have a first thickness that is substantially equal to the first line width. According to the exemplary embodiment, the second silicon oxide layer 250 may be formed through an atomic layer deposition (ALD) scheme. According to the exemplary embodiment, the first thickness of the second silicon oxide layer 250 may be a thin thickness of 10 Å to 1000 Å.

Figure 15:
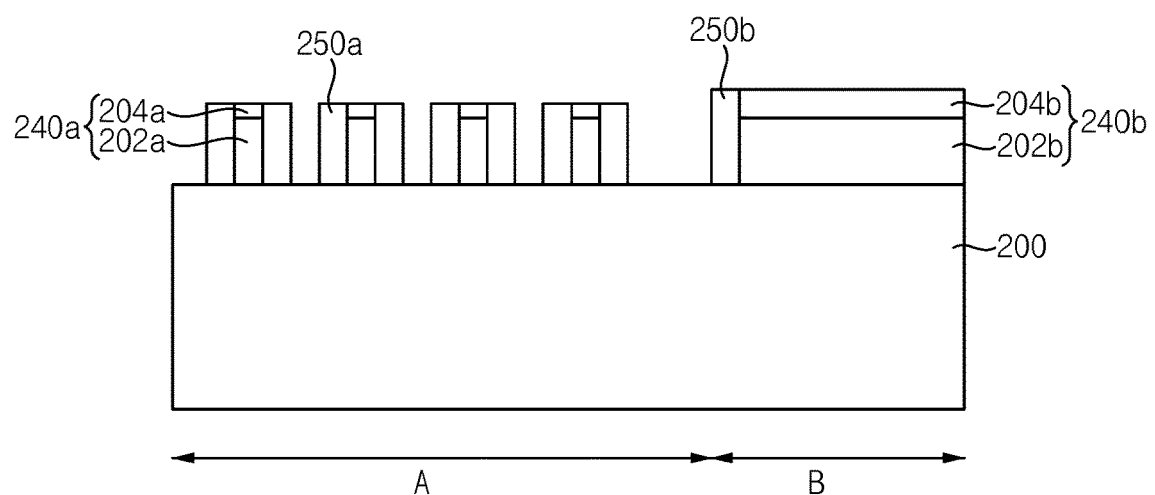

Referring to FIG. 15, a second spacer 250a may be formed on a side wall of the third structure 240a by anisotropically etching the second silicon oxide layer 250. In addition, a side wall spacer 250b may also be formed on a side wall of the fourth structure 240b in the anisotropic etching process.

The third separation layer pattern 204a may also be partially or entirely removed in the etching process. However, due to etch loading, the fourth separation layer pattern 204b may be removed more slowly than the third separation layer pattern 204a, or may be only minimally removed. Therefore, the fourth separation layer pattern 204b may remain to be thicker than the third separation layer pattern 204a.

Figure 16:
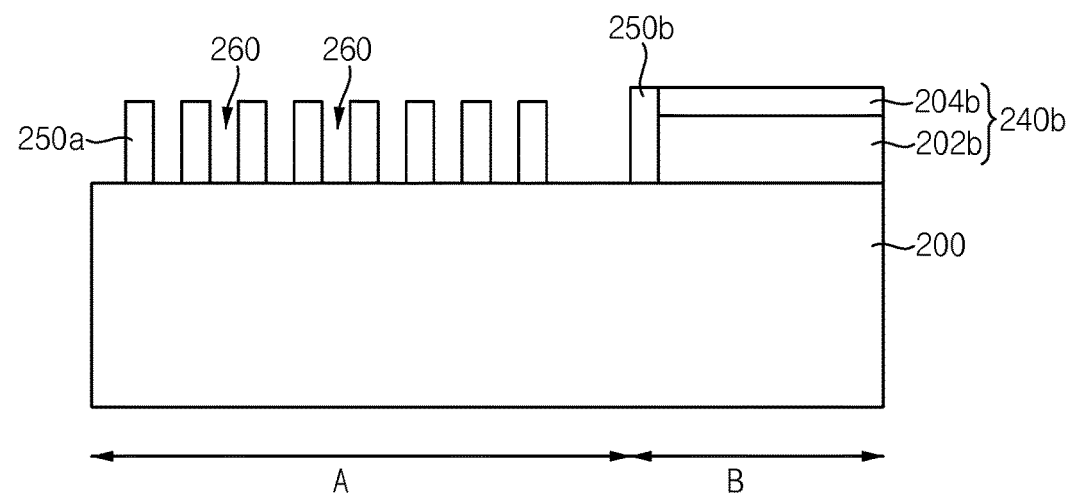

Referring to FIG. 16, the third separation layer pattern 204a may be removed while the fourth separation layer pattern 204b remains. Thereafter, the third mandrel pattern 202a may be removed. The process of removing the third mandrel pattern 202a may include an ashing process or an etching process.

Therefore, the third structure 240a on the cell pattern region A may be removed to form a second gap between the second spacers 250a. The second spacers 250a on the cell pattern region A may have the first line width while being spaced apart from each other by the first line width. Meanwhile, the fourth structure 240b on the peripheral region B may remain without being removed.

Since the second spacers 250a are formed on side walls of the first spacer 220a (see FIG. 13), a width of the second gap 260 between the second spacers 250a may vary according to a line width of the first spacer 220a and the first gap of the first spacers 220a. For example, when the line width of the first spacer 220a is smaller than the first line width, the width of the second gap 260 between the second spacers 250a may not be uniform, and a second gap having a large width and a second gap having a small width may be alternately and repeatedly arranged.

However, as described above, when the second photoresist pattern 230 is reworked through the entire-surface exposure process, a thickness of the first silicon oxide layer 220 may be rarely reduced in the rework process. Therefore, the first spacer 220a may have the first line width, so that the second spacer 250a may have the first line width and the second gap that is uniform. The second spacer 250a may be provided as a hard mask for etching.

The rework scheme described above may be variously applied to a process of forming a silicon oxide layer, which contacts a photoresist pattern, under the photoresist pattern.

The processes described above may be part of a process of forming a semiconductor device, such as a semiconductor chip (e.g., memory chip or logic chip) or semiconductor package. While exemplary embodiments have been particularly shown and described, it will be understood by one of ordinary skill in the art that variations in form and detail may be made therein without departing from the spirit and scope of the claims.

What is claimed is:

1. A method for forming a photoresist pattern, the method comprising:
   i) forming a silicon oxide layer on a substrate;
   ii) forming a first photoresist pattern, which contacts the silicon oxide layer, on the silicon oxide layer, the first photoresist pattern including a defect;
   iii) performing entire-surface exposure on the substrate on which the first photoresist pattern with the defect is formed;
   iv) entirely removing the first photoresist pattern by developing the first photoresist pattern, which has been subject to the entire-surface exposure; and
   v) forming a second photoresist pattern on the silicon oxide layer, which second photoresist pattern contacts the silicon oxide layer.

2. The method of claim 1, wherein the silicon oxide layer is formed by an atomic layer deposition (ALD) scheme.

3. The method of claim 1, wherein the silicon oxide layer has a thickness of 10 Å to 1000 Å.

4. The method of claim 1, wherein a light source used in the entire-surface exposure has a wavelength of 157 nm to 248 nm.

5. The method of claim 1, wherein the entire-surface exposure is performed by using a blank mask under the same process conditions as process conditions for an exposure process for forming the first photoresist pattern.

6. The method of claim 1, wherein the development is performed by using a developer including tetra-methyl ammonium hydroxide (TMAH).

7. The method of claim 1, wherein, during the development, a developer is introduced while the substrate is rotated at a speed of 120 RPM or more.

8. The method of claim 1, wherein each of the first and second photoresist patterns includes a positive photoresist material.

9. The method of claim 1, wherein, after the entire-surface exposure for the first photoresist pattern, the method further comprises performing a baking process of heating the substrate including the first photoresist pattern at a temperature between about 80° C. and about 150° C.

10. The method of claim 1, wherein the steps i) to v) are performed in one photolithography process apparatus.

11. A method for forming a pattern on a substrate, the method comprising:
   forming a first mandrel layer and a first separation layer on the substrate divided into a first region and a second region;
   forming first structures extending to have a line shape while being spaced apart from each other on the substrate in the first region and forming a second structure on the substrate in the second region, by patterning the first mandrel layer and the first separation layer;
   conformally forming a silicon oxide layer having a first thickness on surfaces of the substrate, the first structures, and the second structure;
   forming a first photoresist pattern covering the silicon oxide layer formed on the substrate in the second region and contacting the silicon oxide layer;
   performing entire-surface exposure on the substrate on which the first photoresist pattern is formed when a defect occurs in the first photoresist pattern;
   entirely removing the first photoresist pattern by developing the first photoresist pattern, which has been subject to the entire-surface exposure;
   forming a second photoresist pattern, which covers the silicon oxide layer formed on the substrate in the second region, on the silicon oxide layer;
   forming spacers, each having a first width that is equal to the first thickness, on side walls of the first structures by anisotropically etching the silicon oxide layer by using the second photoresist pattern as an etching mask; and
   removing the first structure between the spacers.

12. The method of claim 11, wherein the silicon oxide layer is formed by an atomic layer deposition (ALD) scheme.

13. The method of claim 11, wherein the first thickness is 10 Å to 1000 Å.

14. The method of claim 11, wherein a light source used in the entire-surface exposure has a wavelength of 157 nm to 248 nm.

15. The method of claim 11, wherein the entire-surface exposure is performed by using a blank mask under a same process condition as an exposure process for forming the first photoresist pattern.

16. The method of claim 11, wherein, during the development, a developer is introduced while the substrate is rotated at a speed of 120 RPM or more.

17. A method for forming a photoresist pattern, the method comprising:
   forming a silicon oxide layer having a first thickness on a substrate;
   forming, by using a photolithography process apparatus, a first photoresist pattern, which contacts the silicon oxide layer, on the silicon oxide layer;
   performing, by an entire-surface exposure unit of the photolithography process apparatus, entire-surface exposure on the substrate on which the first photoresist pattern is formed when a defect occurs in the first photoresist pattern;
   performing, by the photolithography process apparatus, a baking process of heating the substrate including the first photoresist pattern, which has been subject to the entire-surface exposure;
   entirely removing, by the photolithography process apparatus, the first photoresist pattern by developing the first photoresist pattern, which has been subject to the entire-surface exposure; and
   forming, by the photolithography process apparatus, a second photoresist pattern on the silicon oxide layer having the first thickness.

18. The method of claim 17, wherein the first photoresist pattern is formed by performing a coating process, an exposure process, and a development process for a positive photoresist material on the silicon oxide layer.

19. The method of claim 18, wherein the entire-surface exposure is performed by using a blank mask under the same process condition as a process condition used for the exposure process for forming the first photoresist pattern.

20. The method of claim 17, wherein, during the development, a developer is introduced while the substrate is rotated at a speed of 120 RPM or more.

\* \* \* \* \*